United States Patent
Park et al.

(10) Patent No.: US 8,754,410 B2
(45) Date of Patent: Jun. 17, 2014

(54) THIN FILM TRANSISTOR AND ARRAY SUBSTRATE INCLUDING THE SAME

(71) Applicant: LG Display Co., Ltd., Seoul (KR)

(72) Inventors: Heon-Kwang Park, Anyang-si (KR); Dong-Hun Lim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/706,730

(22) Filed: Dec. 6, 2012

(65) Prior Publication Data
US 2013/0140556 A1    Jun. 6, 2013

(30) Foreign Application Priority Data
Dec. 6, 2011   (KR) .......................... 10-2011-0129432

(51) Int. Cl.
*H01L 29/786*    (2006.01)
*H01L 21/336*    (2006.01)

(52) U.S. Cl.
USPC ........................................... 257/43; 438/104

(58) Field of Classification Search
USPC ........................................... 253/43; 438/104
See application file for complete search history.

(56) References Cited

U.S. PATENT DOCUMENTS

| | | | |
|---|---|---|---|
| 6,818,915 B1* | 11/2004 | Koga | 257/10 |
| 2011/0317117 A1* | 12/2011 | Kim et al. | 349/138 |
| 2012/0223300 A1* | 9/2012 | Kang et al. | 257/43 |

* cited by examiner

*Primary Examiner* — Matthew W Such
*Assistant Examiner* — Stephen C Smith
(74) *Attorney, Agent, or Firm* — Fenwick & West LLP

(57) ABSTRACT

An array substrate includes a gate line on a substrate including a pixel region, the gate line extending in one direction; a gate electrode in the pixel region and extending from the gate line; a gate insulating layer on the gate line and the gate electrode; a data line on the gate insulating layer and crossing the gate line to define the pixel region; an oxide semiconductor layer on the gate insulating layer and having three ends, the oxide semiconductor layer corresponding to the gate electrode; an etch stopper on the oxide semiconductor layer to expose the three ends of the oxide semiconductor layer; a source electrode contacting two ends of the three ends of the oxide semiconductor layer and extending from the data line; and a drain electrode contacting one end of the three ends of the oxide semiconductor layer and spaced apart from the source electrode.

15 Claims, 5 Drawing Sheets

THIN FILM TRANSISTOR AND ARRAY SUBSTRATE INCLUDING THE SAME

CROSS-REFERENCE TO RELATED APPLICATION

The present application claims the priority benefit of Korean Patent Application No. 10-2011-0129432 filed in the Republic of Korea on Dec. 6, 2011, which is hereby incorporated by reference.

BACKGROUND

1. Field of the Disclosure

The present disclosure relates to an array substrate for a liquid crystal display (LCD), and more particularly, to an array substrate having an oxide semiconductor layer having highly stable device characteristics and capable of inhibiting parasitic capacitance caused by overlap between a gate electrode and each of source/drain electrodes to improve resolution characteristics and the characteristics of a thin-film transistor (TFT).

2. Discussion of the Related Art

In recent years, with the advent of an information-oriented society, the field of display devices configured to process and display a large amount of information has rapidly been developed. Liquid crystal displays (LCDs) or organic light emitting diodes (OLEDs) have lately been developed as flat panel displays (FPDs) having excellent performance, such as a small thickness, light weight, and low power consumption, and superseded conventional cathode-ray tubes (CRTs).

Among LCDs, an active matrix (AM)-type LCD including an array substrate having a TFT serving as a switching element capable of controlling on/off voltages of each of pixels, may have excellent resolution and capability of displaying moving images.

The AM-type LCD often has TFTs serving as the switching device to turn on and off each of pixel regions.

FIG. 1 is a cross-sectional view of a conventional array substrate 11 of an LCD, which illustrates one pixel region of a TFT.

As shown in FIG. 1, a plurality of gate lines (not shown) and a plurality of data lines 33 may be formed on an array substrate 11, and a plurality of pixel regions P are defined by intersection of the gate lines and the data lines 33. A gate electrode 15 may be formed in a switch region TrA of each of the plurality of pixel regions P. Also, a gate insulating layer 18 may be formed on the entire surface of the resultant structure to cover the gate electrode 15, and a semiconductor layer 28 including an active layer 22 formed of intrinsic amorphous silicon (a-Si) and an ohmic contact layer 26 formed of impurity doped amorphous silicon may be sequentially formed on the gate insulating layer 18.

In addition, a source electrode 36 and a drain electrode 38 may be formed on the ohmic contact layer 26 to correspond to the gate electrode 15, and spaced apart from each other. In this case, the gate electrode 15, the gate insulating layer 18, the semiconductor layer 28, and the source and drain electrodes 36 and 38, which may be sequentially stacked on the switching region TrA, may constitute the TFT.

Furthermore, a passivation layer 42 including a drain contact hole 45 exposing the drain electrode 38 may be formed on the entire surface of the resultant structure to cover the source and drain electrodes 36 and 38 and the exposed active layer 22. A pixel electrode 50 may be separately formed in each of pixel regions P on the passivation layer 42 and in contact with the drain electrode 38 through the drain contact hole 45. In this case, a semiconductor pattern 29 having a double structure including a first pattern 27 and a second pattern 23 may be formed under the data lines 33. The semiconductor pattern 29 may be formed of the same material as the ohmic contact layer 26 and the active layer 22.

On analysis of the semiconductor layer 28 of the TFT formed in the switching region TrA of the conventional array substrate 11 having the above-described structure, it can be seen that a portion of the active layer 22 formed of intrinsic amorphous silicon over which the ohmic contact layer 26 is formed apart from the active layer 22, is formed to a first thickness t1, and another portion of the active layer 22, which is exposed by removing the ohmic contact layer 26, has a second thickness t2 different from the first thickness t1. A difference (t1≠t2) in the thickness of the active layer 22 may be due to a manufacturing process. Due to the difference (t1≠t2) in the thickness of the active layer 22, more specifically, due to a reduction in the thickness of a portion of the active layer 22, which is exposed between the source and drain electrodes 36 and 38 and where a channel layer will be formed, characteristics of the TFT are degraded.

As a result, as shown in FIG. 2, which is a cross-sectional view of one pixel region of a conventional array substrate including a TFT having an oxide semiconductor layer, a TFT including an oxide semiconductor layer 80 having a single structure has lately been developed using an oxide semiconductor material without the need of an ohmic contact layer.

Since the oxide semiconductor layer 80 does not need the ohmic contact layer, unlike the conventional array substrate (refer to 11 in FIG. 1) including the active layer (refer to 22 in FIG. 1) formed of intrinsic amorphous silicon, it is unnecessary to expose the oxide semiconductor layer 80 to a dry etching process to form the ohmic contact layer (refer to 26 in FIG. 1), which is formed of impurity doped amorphous silicon, such that degradation of the characteristics of the TFT Tr may be prevented.

Meanwhile, LCDs having the above-described structure have lately been used for personal portable terminals, such as portable phones and personal digital assistants (PDAs). LCDs used for compact portable terminals may have smaller sizes than LCDs used for televisions (TVs) or monitors.

Accordingly, when the same resolution is embodied, the size of each of pixel regions constituting a display region may be relatively reduced.

Due to the above-described constructive characteristics, in an array substrate of an LCD used for compact portable terminals, the ratio of the area of a TFT in each of the pixel regions to the area of each of the pixel regions is relatively high.

Therefore, since the TFT has a relatively high parasitic capacitance due to overlap between a gate electrode and source/drain electrodes, a variation $\Delta Vp$ in a kick-back voltage or feed-through voltage may also increase. As a result, degradation of charging characteristics of a pixel electrode, flickers, vertical crosstalk, and residual images may occur, thereby deteriorating resolution characteristics.

Furthermore, as shown in FIG. 3, which is a plan view of one pixel region of a conventional array substrate for an LCD including a TFT UTr having a rotated U-shaped channel, in the conventional array substrate for the LCD, the TFT UTr may have a U-shaped or rotated U-shaped channel to improve characteristics of the TFT UTr and increase an overlay margin. The TFT UTr having a U-shaped channel structure may reduce a variation in parasitic capacitance between a gate electrode 90 and source/drain electrodes 93 and 94 caused by process errors.

However, when the TFT including an oxide semiconductor layer has the U-shaped or rotated U-shaped channel structure, the area of an etch stopper may increase, so the oxide semiconductor layer disposed outside the etch stopper should be configured to contact the source/drain electrodes 93 and 94. As a result, the area of the TFT UTr may increase.

When the area of the TFT TUr increases, the aperture ratio of the pixel region may be reduced, and the entire parasitic capacitance caused by overlap between the gate electrode 90 and the source/drain electrodes 93 and 94 may also substantially increase.

Accordingly, when the TFT UTr including the U-shaped channel is formed on an array substrate for LCDs for compact portable terminals, the aperture ratio of the pixel region decreases.

In addition, since the overlap area between the gate electrode 90 and the source/drain electrodes 93 and 94 further increases relatively in the TFT UTr having the U-shaped channel structure, parasitic capacitance Cgs caused by overlap between the gate electrode 90 and the source/drain electrodes 93 and 94 may further increase relatively, thereby further deteriorating resolution characteristics.

SUMMARY OF THE INVENTION

Accordingly, the present invention is directed to a display device that substantially obviates one or more of the problems due to limitations and disadvantages of the related art.

An object of the present disclosure is to provide an array substrate including an oxide semiconductor layer, which may reduce an overlap area between source/drain electrodes and a gate electrode, and reduce parasitic capacitance caused by overlap between the source/drain electrodes and the gate electrode to improve characteristics of a thin-film transistor (TFT).

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate includes a gate line on a substrate including a pixel region, the gate line extending in one direction; a gate electrode in the pixel region and extending from the gate line; a gate insulating layer on the gate line and the gate electrode; a data line on the gate insulating layer and crossing the gate line to define the pixel region; an oxide semiconductor layer on the gate insulating layer and having three ends, the oxide semiconductor layer corresponding to the gate electrode; an etch stopper on the oxide semiconductor layer to expose the three ends of the oxide semiconductor layer; a source electrode contacting two ends of the three ends of the oxide semiconductor layer and extending from the data line; and a drain electrode contacting one end of the three ends of the oxide semiconductor layer and spaced apart from the source electrode.

In another aspect, a thin-film transistor (TFT) includes a gate electrode; a gate insulating layer on the gate electrode; an oxide semiconductor layer on the gate insulating layer and having three ends, the oxide semiconductor layer corresponding to the gate electrode; an etch stopper on the gate electrode; an etch stopper on the oxide semiconductor layer to expose the three ends of the oxide semiconductor layer; a source electrode contacting two ends of the three ends of the oxide semiconductor layer and extending from the data line; and a drain electrode contacting one end of the three ends of the oxide semiconductor layer and spaced apart from the source electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 4:
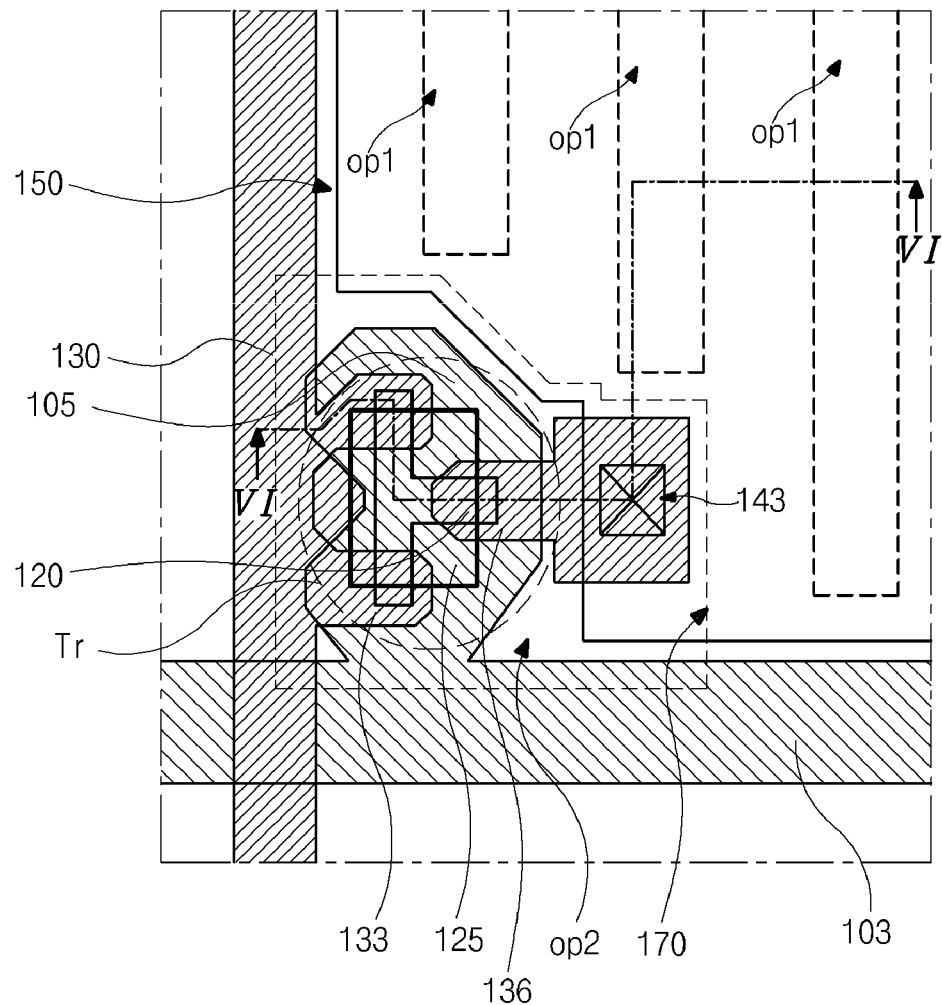
FIG. 4 is an enlarged plan view of a TFT formed in one pixel region of an array substrate for an LCD including a TFT having an oxide semiconductor layer according to a first embodiment of the present invention.

FIG. 4 is an enlarged plan view of a TFT formed in one pixel region of an array substrate 101 for an LCD including a TFT having an oxide semiconductor layer according to a first embodiment of the present invention.

As shown in FIG. 4, a gate line 103 may be formed in one direction, and a data line 130 may be formed to intersect the gate line 103 and define a pixel region. In this case, a gate electrode 105 may be branched from the gate line 103 and formed in each of pixel regions P.

Also, a TFT serving as a switching element may be formed near an intersection between the gate line 103 and the data line 130 in each of the pixel regions P, and connected to each of the gate line 103 and the data line 130.

In this case, the TFT may include a gate electrode 105 connected to the gate line 103, a gate insulating layer (not shown), an oxide semiconductor layer 120, an etch stopper 125, and a source electrode 133 and a drain electrode 136 formed apart from each other on the etch stopper 125.

In this case, the oxide semiconductor layer 120 has three ends. In FIG. 4, the oxide semiconductor layer 120 has a T shape or a rotated-T shape in a plan view, but the shape of the oxide semiconductor layer 120 is not limited thereto.

The source electrode 133 may be in contact with two ends disposed in a straight line of the T or rotated-T plane shaped oxide semiconductor layer 120, and the drain electrode 136 may be in contact with the remaining one end of the oxide semiconductor layer 120.

Specifically, the source electrode 133 may have two ends extending from the data line 130 and spaced apart from each other. For example, the source electrode 133 may have a U shape or a rotated-U shape. The drain electrode 136 may have a bar shape that may extend in a region where the two ends of the source electrode 133 are spaced apart from each other. The oxide semiconductor layer 120 may be in contact with ends of the source electrode 133 and drain electrode 136 having the above-described shapes, and have the T shape or the rotated-T shape.

Meanwhile, the etch stopper 125 may be formed between the oxide semiconductor layer 120 and the source electrode 133 and drain electrode 136. The etch stopper 125 may overlap a central portion of the T-shaped or rotated T-shaped oxide semiconductor layer 120 and simultaneously, expose each of the three ends of the oxide semiconductor layer 120.

In this case, the source electrode 133 and drain electrode 136 may be formed such that the opposite ends of the source electrode 133 and drain electrode 136 are disposed in one straight line. Alternatively, as illustrated in a second embodiment, the bar-shaped drain electrode 136 may be inserted into a region where both ends of the U-shaped or rotated U-shaped source electrode 133 are spaced apart from each other. In other words, an end of the bar-shaped drain electrode 136 may be inserted into an opening between two ends of the U-shaped source electrode 133.

In the TFT formed on the array substrate 101 having the above-described constructions according to the embodiment and modified example of the present invention, the source electrode 133 may have the U shape or the rotated-U shape, so a variation in overlay can be smaller than in a TFT in which source and drain electrodes face each other in an I shape or a rotated-I shape. Thus, a reduction in the variation in overlay may result in a variation in parasitic capacitance.

Furthermore, unlike a conventional TFT (refer to UTr of FIG. 3) having a U-shaped or rotated U-shaped channel in which the oxide semiconductor layer 120 is formed to cover the entire region where opposite ends of the U-shaped source electrode 133 are spaced apart from each other to form the U-shaped or rotated U-shaped channel, the oxide semiconductor layer 120 according to the present invention may be formed in a T shape or rotated-T shape to overlap the facing ends of the source electrode 133 and one end of the drain electrode 136. Thus, the area of the etch stopper 125 may be reduced more than in the conventional TFT (refer to UTr of FIG. 3) having the U-shaped channel. As a result, since the area of the TFT Tr may be made compact, an area occupied by the TFT in the pixel region P may be reduced to improve an aperture ratio.

Moreover, since the oxide semiconductor layer 120 is not provided on the entire region where the opposite ends of the source electrode 133 are spaced apart from each other, it may be unnecessary to form the gate electrode 105 on the entire region where the opposite ends of the source electrode 133 are spaced apart from each other. Therefore, as shown in FIG. 4, the gate electrode 105 may be removed from a portion of the region, where the opposite ends of the source electrode 133 are spaced apart from each other and the oxide semiconductor layer 120 is not formed.

Accordingly, since the overlap region between the source electrode 133 and the gate electrode 105 may be relatively reduced, parasitic capacitance Cgs caused by overlap between the gate electrode 105 and the source electrode 133 may be reduced.

As described above, in the array substrate 101 according to the embodiment of the present invention, due to a reduction in parasitic capacitance Cgs caused by the shrinkage of the overlap area between the gate electrode 105 and the source electrode 133, charging characteristics of a pixel electrode 150 disposed in each of the pixel regions P may be improved. Simultaneously, flickers, vertical crosstalk, and residual images caused by a variation $\Delta Vp$ in kick-back voltage or feed-through voltage may be reduced, thereby enhancing resolution characteristics.

Figure 1:
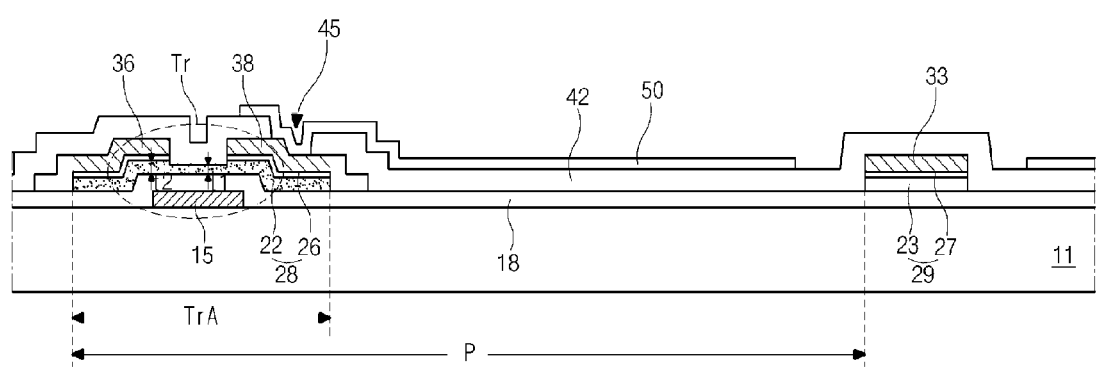
FIG. 1 is a cross-sectional view of a conventional array substrate of a liquid crystal display (LCD), which illustrates one pixel region of a thin film transistor (TFT)
Figure 2:
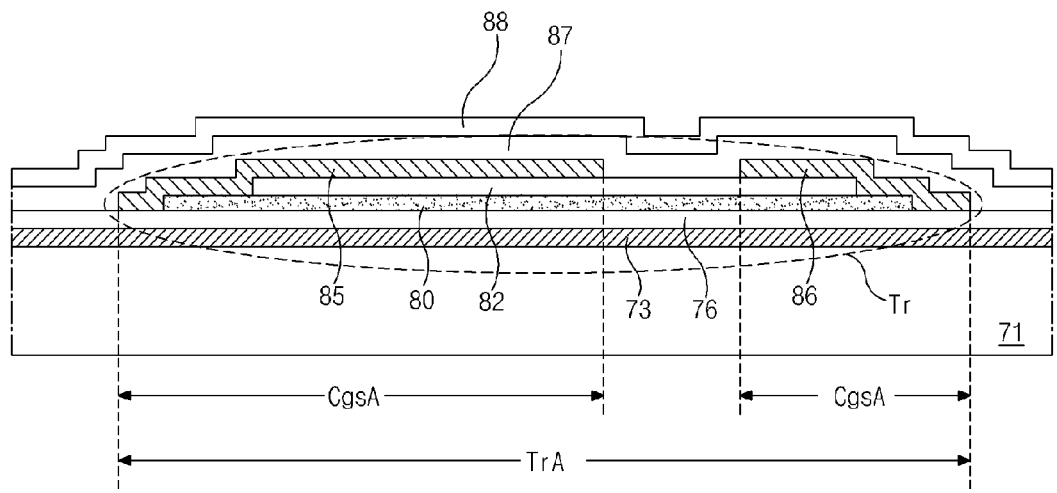
FIG. 2 is a cross-sectional view of one pixel region of a conventional array substrate including a TFT having an oxide semiconductor layer.
Figure 3:
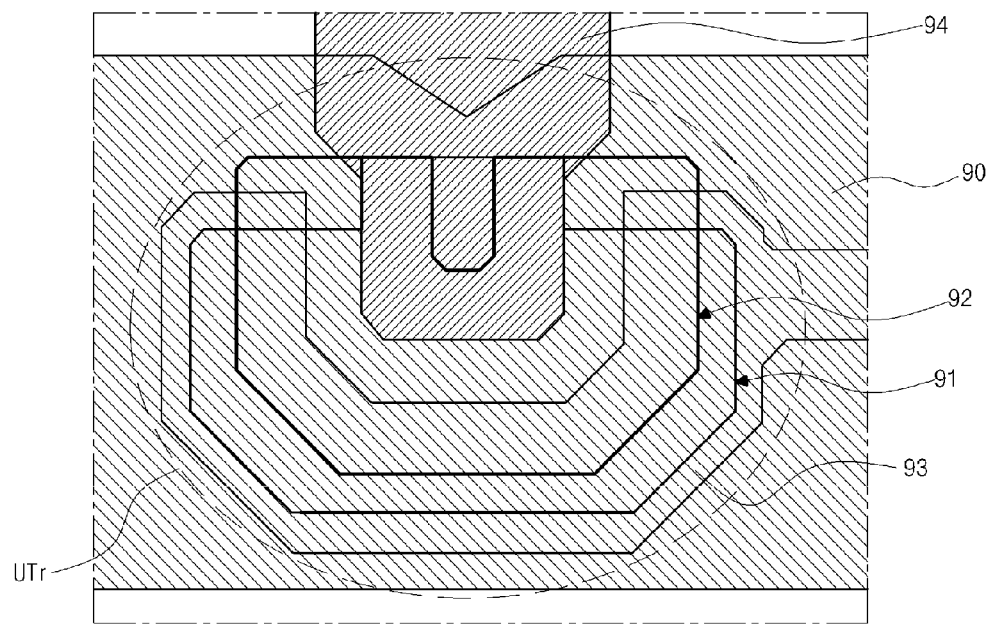
FIG. 3 is a plan view of one pixel region of a conventional array substrate for an LCD including a TFT having a rotated U-shaped channel.

Meanwhile, referring to FIG. 3, which shows formation of an oxide semiconductor layer 91 having a rotated U-shaped channel according to the related art, assuming that the source and drain electrodes 93 and 94 having the same constructions as in the embodiment or modified example of the present invention, when the oxide semiconductor layer 91 is formed to cover the entire region where two opposite ends of the source electrode 93 are spaced apart from each other to form a typical U-shaped channel or rotated U-shaped channel in the oxide semiconductor layer 91, the area of the oxide semiconductor layer 91 may increase more than in the array substrate 101 according to the embodiment or modified example of the present invention. Also, since the area of an etch stopper 92 formed to overlap the oxide semiconductor layer 91 also naturally increases, the areas of the source and drain electrodes 93 and 94 to be formed in contact with the oxide semiconductor layer 91 exposed outside the etch stopper 92 in consideration of a process margin, should increase. As a result, it can be seen that the area of the TFT increases more than in each of the array substrates (refer to 101 in FIGS. 4 and 5) according to the embodiment and modified example of the present invention.

Figure 5:
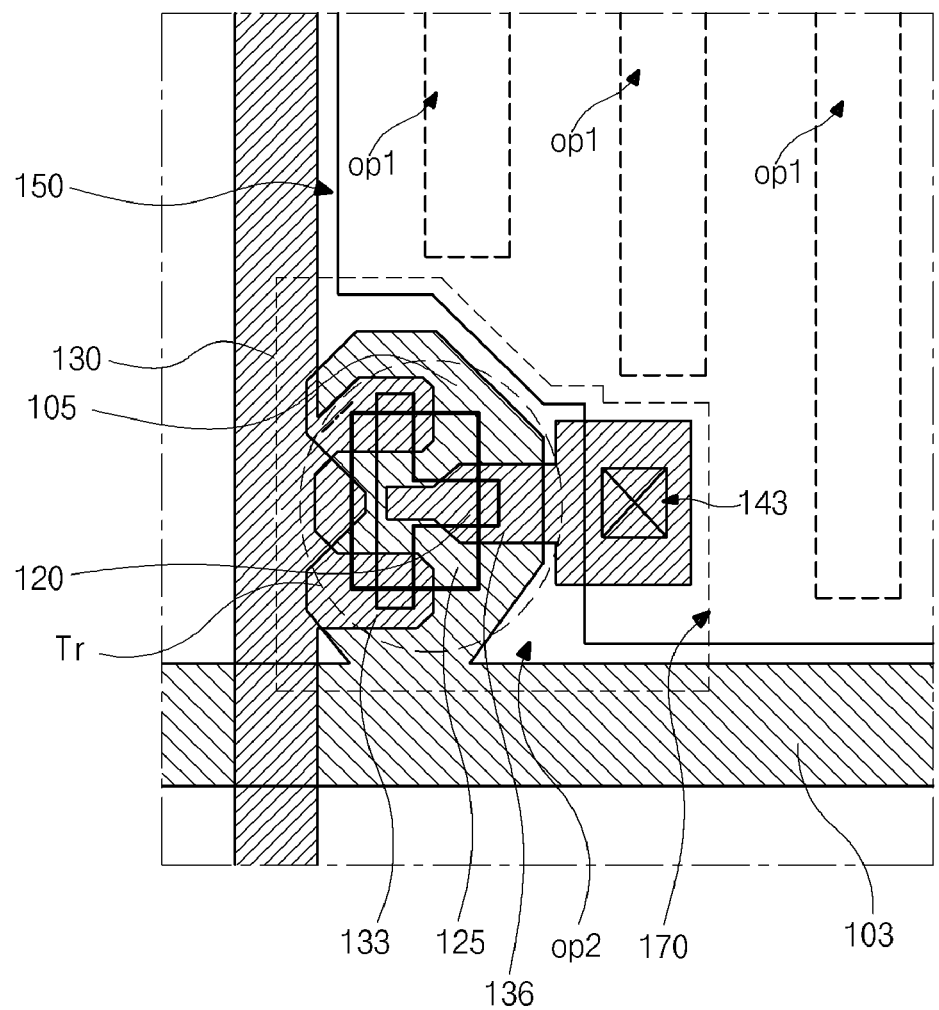
FIG. 5 is an enlarged plan view of a TFT formed in one pixel region of an array substrate for an LCD including a TFT having an oxide semiconductor layer according to a modified example of the first embodiment of the present invention.

Meanwhile, referring to FIGS. 4 and 5, a pixel electrode 150 may be formed in each of the pixel regions P on each of the array substrates 101 according to the embodiment and modified example of the present invention, which may include the TFT having the above-described construction. The pixel electrode 150 may be in contact with the drain electrode 136 through a drain contact hole 143 exposing the drain electrode 136.

In this case, a transparent common electrode 170 may be further provided on the array substrate 101 by interposing a second passivation layer (not shown) formed of an insulating material between the transparent common electrode 170 and the array substrate 101. The transparent common electrode 170 may include a plurality of bar-shaped first openings op1 corresponding to the pixel electrode 150, and a second opening op2 corresponding to the TFT Tr. However, the common electrode 170 having the plurality of first openings op1 and the second opening op2 may be omitted depending on the drive mode of the LCD.

When the common electrode 170 having the plurality of first openings op1 and the second opening op2 is provided in addition to the pixel electrode 150, the array substrate 101 may be an array substrate 101 for a fringe field switching (FFS)-mode LCD. When the common electrode 170 is omitted and only the pixel electrode 150 is provided, the array substrate 101 may be an array substrate (not shown) for a twisted nematic (TN)-mode LCD. When the pixel electrode 150 includes a plurality of bar-shaped pixel electrodes spaced a predetermined distance apart from one another in the respective pixel regions P, and a plurality of bar-shaped common electrodes (not shown) are alternately formed with the bar-shaped pixel electrodes, the array substrate 101 may be an array substrate (not shown) for an in-plane switching-mode LCD.

Meanwhile, although FIGS. 4 and 5 illustrate that the plurality of first openings op1 included in the common electrode 170 have straight bar shapes in each of the pixel regions P, the plurality of first openings op1 may have symmetrically bent shapes based on a central portion of each of the pixel regions P so that different domain regions can be formed in each of the pixel regions P.

When a double domain is embodied in each of the pixel regions P by forming the plurality of bar-shaped first openings op1 in different directions, a variation in chrominance relative to a viewing angle may be inhibited in an LCD including the double domain to improve display quality.

Hereinafter, cross-sectional construction of the array substrate 101 having the above-described construction, according to the embodiment of the present invention, will be described.

Figure 6:
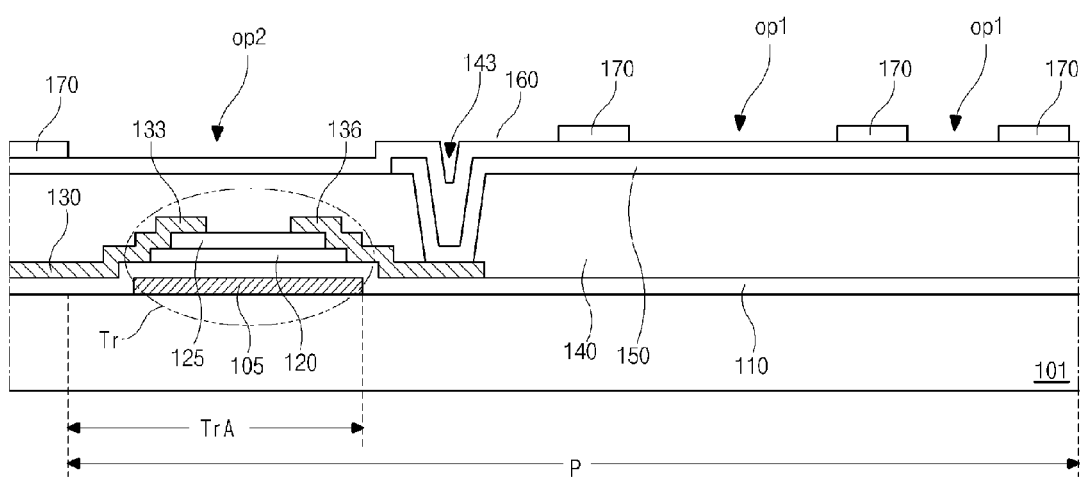
FIG. 6 is a cross-sectional view of the TFT, which is taken along line VI-VI of FIG. 4.

FIG. 6 is a cross-sectional view of the TFT, which is taken along line VI-VI of FIG. 4. A portion of each of the pixel regions P in which the TFT is formed will be defined as a switching region TrA for brevity.

A gate line (not shown) may be formed on a transparent insulating substrate 101 and extend in a first direction. The gate line may be formed of a metal material having low-resistance characteristics, for example, one selected out of aluminum (Al), an Al alloy (e.g., aluminum-neodymium (AlNd)), copper (Cu), a Cu alloy, chromium (Cr), and molybdenum (Mo). A gate electrode 105 may be connected to the gate line and formed in each of switching regions TrA. In this case, the gate electrode 105 may be branched from the gate line.

In addition, a gate insulating layer 110 may be formed on the entire surface of the substrate 101 to cover the gate line and the gate electrode 105. The gate insulating layer 110 may be formed of an inorganic insulating material, for example, silicon oxide ($SiO_2$) or silicon nitride ($SiN_x$).

Furthermore, an oxide semiconductor layer 120 may be formed on the gate insulating layer 110 in the switching region TrA to correspond to the gate electrode 105. The oxide semiconductor layer 120 may have a T or rotated-T plane shape and be formed of a zinc oxide (ZnO)-based semiconductor material, for example, any one of indium gallium zinc oxide (IGZO), zinc tin oxide (ZTO), and zinc indium oxide (ZIO).

An etch stopper 125 having an island shape may be provided on the T-shaped or rotated T-shaped oxide semiconductor layer 120 to expose top surfaces of three ends of the T-shaped or rotated T-shaped oxide semiconductor layer 120. The etch stopper 125 may be formed of an inorganic insulating material, for example, silicon oxide or silicon nitride.

A data line 130 may be formed on the gate insulating layer 115 and extend in a second direction. The data line 130 may intersect the gate line (not shown) to define the pixel region P.

Also, a source electrode 133 and a drain electrode 136 may be formed on the etch stopper 125 and spaced apart from each other. The source electrode 133 may have a U shape or a rotated U shape, and the drain electrode 136 may have a bar shape.

In this case, the U-shaped or rotated U-shaped source electrode 133 may be in contact with each of top surfaces of two ends of the T-shaped or rotated T-shaped oxide semiconductor layer 120, which are exposed outside the etch stopper 125 and disposed in one straight line, while the bar-shaped drain electrode 136 may be in contact with a top surface of the remaining one end of the T-shaped or rotated T-shaped oxide semiconductor layer 120.

Meanwhile, the gate electrode 105, the gate insulating layer 110, the T-shaped or rotated T-shaped oxide semiconductor layer 120, the etch stopper 125 configured to expose the three ends of the oxide semiconductor layer 120, and the separately formed source and drain electrodes 133 and 136, which may be sequentially stacked on the switching region TrA, may constitute the TFT. In this case, the TFT may have a T-shaped or rotated T-shaped channel structure due to the characteristics of plane structures of the source and drain electrodes 133 and 136.

Furthermore, a first passivation layer 140 may be formed on the entire substrate of the substrate 101 to cover the data line 130 and the TFT Tr. The first passivation layer 140 may be formed of an inorganic insulating material or an organic insulating material. For example, the inorganic insulating material may be selected from silicon oxide or silicon nitride, and the organic insulating material may be selected from benzocyclobutene (BCB) or photo-acryl. In this case, the first passivation layer 140 may have a drain contact hole (refer to 143 in FIG. 4) exposing a second region 136b of the drain electrode 136 of the TFT Tr.

In addition, a plate-type pixel electrode 150 may be formed on the first passivation layer 140 having the drain contact hole (refer to 143 in FIG. 4) in each of the pixel regions P. The plate-type pixel electrode 150 may be in contact with the drain electrode 136 through the drain contact hole. The pixel electrode 150 may be formed of a transparent conductive material, for example, indium tin oxide (ITO) or indium zinc oxide (IZO).

An array substrate having the above-described cross-sectional construction, according to the embodiment of the present invention, may constitute an array substrate for a TN-mode LCD.

In the case of an array substrate 101 for an FFS-mode LCD, as shown, a second passivation layer 160 may be formed using the inorganic insulating material or the organic insulating material on the entire surface of the substrate 101 to cover the pixel electrode 150. A plate-type common electrode 170 may be formed using the transparent conductive material on the entire surface of a display region including the pixel regions P to cover the second passivation layer 160.

The common electrode 170 may include a second opening op2 corresponding to the switching region TrA formed in each of the pixel regions P, and a plurality of bar-shaped first openings op1 corresponding to each of the pixel electrodes 150. In this case, the plurality of bar-shaped first openings op1 may have symmetrically bent shapes based on a central portion of each of the pixel regions P.

Although FIG. 6 illustrates that three bar-shaped first openings op1 are formed in the common electrode 170 in each of the pixel regions P and spaced apart from each other at regular intervals, the number of the first openings op1 corresponding to each of the pixel regions P may be appropriately selected within a wide range of 2 to 15 to form an efficient fringe field.

Although not shown, when the array substrate 101 is an array substrate (not shown) for an in-plane switching-mode LCD, a common line (not shown) may be formed parallel to the gate line (not shown) at the same layer as the gate line. Also, a plurality of bar-shaped pixel electrodes (not shown) may be formed instead of the plate-type pixel electrode 150 on the first passivation layer 140, and a plurality of bar-shaped common electrodes (not shown) may be formed parallel to and apart from the plurality of bar-shaped pixel electrodes and alternate with the plurality of bar-shaped pixel electrodes.

In this case, one end of the plurality of bar-shaped pixel electrodes may be all connected in each of the pixel regions P. The plurality of bar-shaped pixel electrodes may be in contact with the drain electrode 136 through a drain contact hole (not shown) included in the first passivation layer 140. One end of the plurality of bar-shaped common electrodes may be all connected. The plurality of bar-shaped common electrodes may be in contact with the common line of the first passivation layer 140 through a common contact hole (not shown) exposing the common line.

According to the present invention, a channel of a TFT can be formed in a T shape or rotated-T shape and simultaneously, a gate electrode branched from a gate line can be configured to reduce an overlap area between the gate electrode and a drain electrode. As a result, parasitic capacitance Cgs caused by overlap between the gate electrode and source/drain electrodes can be reduced to improve charging characteristics of a pixel electrode. Also, vertical crosstalk and residual images due to the characteristics and parasitic capacitance Cgs of the TFT can be inhibited to enhance image quality.

It will be apparent to those skilled in the art that various modifications and variations can be made in a display device of the present disclosure without departing from the spirit or scope of the invention. Thus, it is intended that the present invention covers the modifications and variations of this invention provided they come within the scope of the appended claims and their equivalents.

What is claimed is:

1. An array substrate comprising:
   a gate line on a substrate including a pixel region, the gate line extending in one direction;
   a gate electrode in the pixel region and extending from the gate line;
   a gate insulating layer on the gate line and the gate electrode;
   a data line on the gate insulating layer and crossing the gate line to define the pixel region;
   an oxide semiconductor layer on the gate insulating layer and having three ends, the oxide semiconductor layer corresponding to the gate electrode;
   an etch stopper on the oxide semiconductor layer to expose the three ends of the oxide semiconductor layer;
   a source electrode contacting two ends of the three ends of the oxide semiconductor layer and extending from the data line; and
   a drain electrode contacting one end of the three ends of the oxide semiconductor layer and spaced apart from the source electrode,
   wherein overlap area of the source electrode and the two ends of the three ends of the oxide semiconductor layer is smaller than the source electrode area, and overlap area of the drain electrode and the two ends of the three ends of the oxide semiconductor layer is smaller than the drain electrode area.

2. The array substrate according to claim 1, wherein the source electrode has a U shape, and the drain electrode has a bar shape.

3. The array substrate according to claim 2, wherein the drain electrode is inserted into an opening of the source electrode.

4. The array substrate according to claim 1, wherein the oxide semiconductor layer includes one of indium gallium zinc oxide (IGZO), zinc tin oxide (ZTO) and zinc indium oxide (ZIO).

5. The array substrate according to claim 1, wherein a channel formed in the oxide semiconductor layer has a T shape.

6. The array substrate according to claim 1, further comprising:
   a first passivation layer on the data line and the source and drain electrodes, the first passivation layer having a drain contact hole exposing the drain electrode; and
   a pixel electrode on the first passivation layer in the pixel region and contacting the drain electrode through the drain contact hole.

7. The array substrate according to claim 6, further comprising:
   a second passivation layer on the pixel electrode; and
   a common electrode on the second passivation layer and having a plurality of bar-shaped first openings corresponding to the pixel region.

8. The array substrate according to claim 7, wherein the common electrode further includes a second opening corresponding to the source and drain electrodes and the etch stopper exposed between the source and drain electrodes.

9. The array substrate according to claim 8, wherein the plurality of bar-shaped first openings have symmetrically bent shapes with respect to a central portion of each of pixel regions.

10. The array substrate according to claim 6, further comprising:
    a common line disposed on the same layer as the gate line and being parallel to the gate line; and
    a common electrode on the first passivation layer and including a plurality of first bar shaped electrodes,
    wherein the pixel electrode includes a plurality of second bar shaped electrodes alternately arranged with the plurality of first bar shaped electrodes, and wherein the first passivation layer includes a common contact hole exposing the common line, and the common electrode contacts the common line through the common contact hole.

11. A thin-film transistor (TFT) comprising:
    a gate electrode;
    a gate insulating layer on the gate electrode;
    an oxide semiconductor layer on the gate insulating layer and having three ends, the oxide semiconductor layer corresponding to the gate electrode;
    an etch stopper on the oxide semiconductor layer to expose the three ends of the oxide semiconductor layer;
    a source electrode contacting two ends of the three ends of the oxide semiconductor layer and extending from the data line; and
    a drain electrode contacting one end of the three ends of the oxide semiconductor layer and spaced apart from the source electrode,
    wherein overlap area of the source electrode and the two ends of the three ends of the oxide semiconductor layer is smaller than the source electrode area, and overlap area of the drain electrode and the two ends of the three ends of the oxide semiconductor layer is smaller than the drain electrode area.

12. The TFT according to claim 11, wherein the source electrode has a U shape, and the drain electrode has a bar shape.

13. The TFT according to claim 12, wherein the drain electrode is inserted into an opening of the source electrode.

14. The TFT according to claim 11, wherein the oxide semiconductor layer includes one of indium gallium zinc oxide (IGZO), zinc tin oxide (ZTO) and zinc indium oxide (ZIO).

15. The TFT according to claim 11, wherein a channel formed in the oxide semiconductor layer has a T shape.

* * * * *